United States Patent [19]

Averell

[11] Patent Number: 5,792,268
[45] Date of Patent: Aug. 11, 1998

[54] PRINTERED CIRCUIT BOARD SCREEN PRINTER VACUUM HOLDING APPARATUS

[75] Inventor: Michael H. Averell, Richmond, Me.

[73] Assignee: SCI Systems, Inc., Huntsville, Ala.

[21] Appl. No.: 378,988

[22] Filed: Jan. 24, 1995

Related U.S. Application Data

[63] Continuation of Ser. No. 87,539, Jul. 2, 1993, abandoned.

[51] Int. Cl.[6] .............................. B05C 13/02; B25B 11/00
[52] U.S. Cl. .................... 118/500; 269/21; 269/903
[58] Field of Search ........................ 118/406, 500, 118/504; 101/126, 389.1; 248/362, 683; 269/21, 58, 903

[56] References Cited

U.S. PATENT DOCUMENTS

| | | | |
|---|---|---|---|
| 3,233,887 | 2/1966 | Dunham | 269/21 |
| 3,355,078 | 11/1967 | Smith | 228/44.7 |
| 3,617,045 | 11/1971 | Da Costa | 269/21 |
| 3,765,431 | 10/1973 | Jannett et al. | 134/113 |
| 4,582,305 | 4/1986 | Brothers | 269/21 X |
| 4,784,377 | 11/1988 | Woodward | 269/21 |
| 4,795,518 | 1/1989 | Meinel et al. | 269/21 X |
| 4,916,807 | 4/1990 | Wiese | 29/840 |
| 4,964,335 | 10/1990 | Klemm | 101/129 |
| 5,054,193 | 10/1991 | Ohms et al. | 29/840 |
| 5,141,212 | 8/1992 | Beeding | 269/21 |

*Primary Examiner*—Robert J. Warden
*Assistant Examiner*—E. Leigh Dawson
*Attorney, Agent, or Firm*—Curtis, Morris & Safford, P.C.; Gregor N. Neff

[57] ABSTRACT

Apparatus for supporting and holding a circuit board in place in a machine for screen printing a major surface thereof with solder paste. The apparatus includes a member with a surface on which a circuit board rests as the board receives solder paste printing through a screen. The surface has a main groove and distribution grooves that intersect the main groove in communicating relationship therewith at spaced locations along its length. Further, the member has an air removal passageway extending therethrough from one side to the opposite side thereof. The passageway terminates on the one side of the member at an opening located in the main groove. A circuit board resting on the surface over the grooves is held in place during screen printing with solder paste as a result of reduced air pressure established in the grooves when air is withdrawn therefrom through the passageway.

4 Claims, 8 Drawing Sheets

PRINTERED CIRCUIT BOARD SCREEN PRINTER VACUUM HOLDING APPARATUS

This application is a continuation, of application Ser. No. 08/087,539, filed Jul. 2, 1993, now abandoned

BACKGROUND OF THE INVENTION

This invention relates to a screen printer for circuit boards and more particularly to vacuum holding apparatus used in a screen printer for supporting and holding circuit boards in position during screen printing.

Printed circuit boards are used to support and interconnect components such as integrated circuits, resistors, capacitors and the like. Developments in recent years have drastically reduced the size of electronic components and have increased their density on circuit boards. As a result, surface mounting techniques have been developed to adequately support and interconnect these complex components in ever increasing density.

Surface mounting techniques differ from conventional techniques. Conventional techniques mount components on a circuit board by inserting their leads into holes in the board. By contrast, surface mounting techniques mount components on a circuit board by soldering their leads to solder pads on the surface of the board.

Surface mounting electronic components to a circuit board normally includes three major steps. The first step applies solder paste to all the solder pads of the board, usually by a screen printing machine. The second step places the components on the board with the leads of the components properly aligned with the solder pads. The third step applies heat to the resulting assembly, usually by baking the assembly in an oven, to reflow the solder paste and thereby fix the leads to their respective solder pads.

Screen printing machines normally use a metal stencil, known as a screen or foil, through the openings of which solder paste is squeegeed onto a circuit board. And, as indicated, great precision is required in proper alignment between the metal screen and the circuit board. This means that each circuit board must be carefully positioned with respect to the foil and held in place during screening, often through the use of vacuum hold down arrangement.

Prior vacuum hold down approaches have not been altogether satisfactory. There have been practical production problems encountered, particularly involving the screen printing of a circuit board already having components soldered on one side. Because of the delicate nature of electronic components, care must be taken not to damage any of these components during support and vacuum hold down. Consequently, continuous surface supports have not found wide use. But one approach that has found considerable use employs individual magnetic support pins and blocks carefully positioned to support a circuit board from underneath during printing by squeegeeing solder paste through openings in a foil or screen. Pins and blocks are placed at various predetermined places (and held in place by their magnets) in a vacuum chuck or chamber so that a circuit board placed on the chuck and the support pins and blocks is supported from underneath without touching any components or component leads. A vacuum is established in the vacuum chuck that holds the board in place against the upper surfaces of the pins and blocks during squeegeeing. Unfortunately, proper placement of the magnetic pins and blocks takes a long time and must be changed for each different circuit board configuration. Consequently, production is slowed.

Accordingly, there is a need for an improved vacuum hold down arrangement.

SUMMARY OF THE INVENTION

An object of the invention is improved apparatus for and method of supporting and holding in place a circuit board during screen printing solder paste thereon.

Another object of the invention is improved apparatus for and method of supporting and holding in place a circuit board having electronic components fixed on one side thereof during screen printing solder paste on the opposite side thereof.

These and other objects are attained, in one sense, by apparatus for supporting and holding a circuit board in place in a machine for screen printing a major surface thereof with solder paste that comprises a member having one side with a planar support surface on which a circuit board rests as the board receives solder paste printing through a screen. The support surface has a main groove and distribution grooves arranged so the distribution grooves intersect the main groove in communicating relationship at spaced locations along its length. Further, the member has only one air removal passageway and this passageway extends through the member from the one side to the opposite side. The air removal passageway terminates on the one side of the member at an opening located in the main groove. The opening allows withdrawal of air from the main and distribution groove through the passageway during operation when the member is located in screen printing position. Accordingly, a circuit board resting on the support surface over the grooves is held in place during screen printing with solder paste from reduce air pressure established in the grooves when air is withdrawn therefrom through the passageway.

The above and other objectives are attained, in another sense, by apparatus for supporting and holding a circuit board in place in a machine for screen printing a major surface thereof with solder paste that comprises a member having one side with a planar support surface on which a circuit board rests as the board receives solder paste printing through a screen . The support surface has a pocket recess and a groove in close spaced apart relationship with the recess. Further, the member has an air removal passageway extending therethrough from the one side to the opposite side thereof. The passageway terminates on the one side of the member at an opening in the groove, which allows withdrawal of air from the groove th rough the passageway during operation when the member is located in screen printing position. The surfaces of the member defining the pocket recess are continuous and without any air withdrawal opening therein. Accordingly, a circuit board resting on the support surface over the pocket recess and the groove is held in place during screen printing as a result of reduced air pressure established in the groove when air is withdrawn therefrom through the passageway.

Other objects and advantages will become apparent as the invention is described in more detail with reference made to the accompanying drawings.

DESCRIPTION OF THE DRAWINGS

FIG. 3 also shows a stencil (or screen) frame in located to be placed in position in the printer.

DESCRIPTION OF THE PREFERRED EMBODIMENTS

Figures 1, 2:
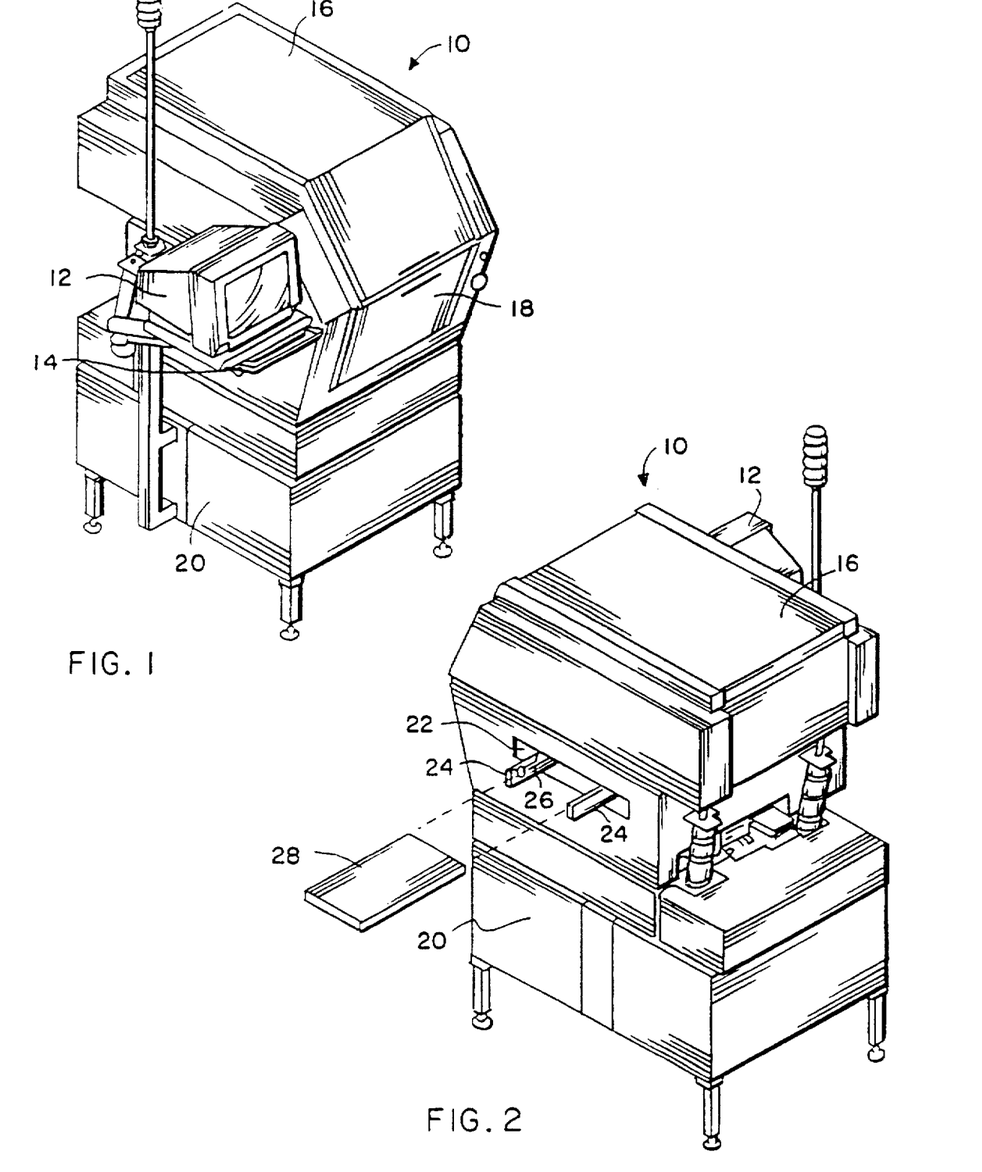
FIG. 1 is a front perspective view of a screen printer incorporating apparatus for supporting and vacuum holding a circuit board in place during printing according to the principles of the invention.
FIG. 2 is a rear perspective view of the screen printer shown in FIG. 1.
Figure 3:
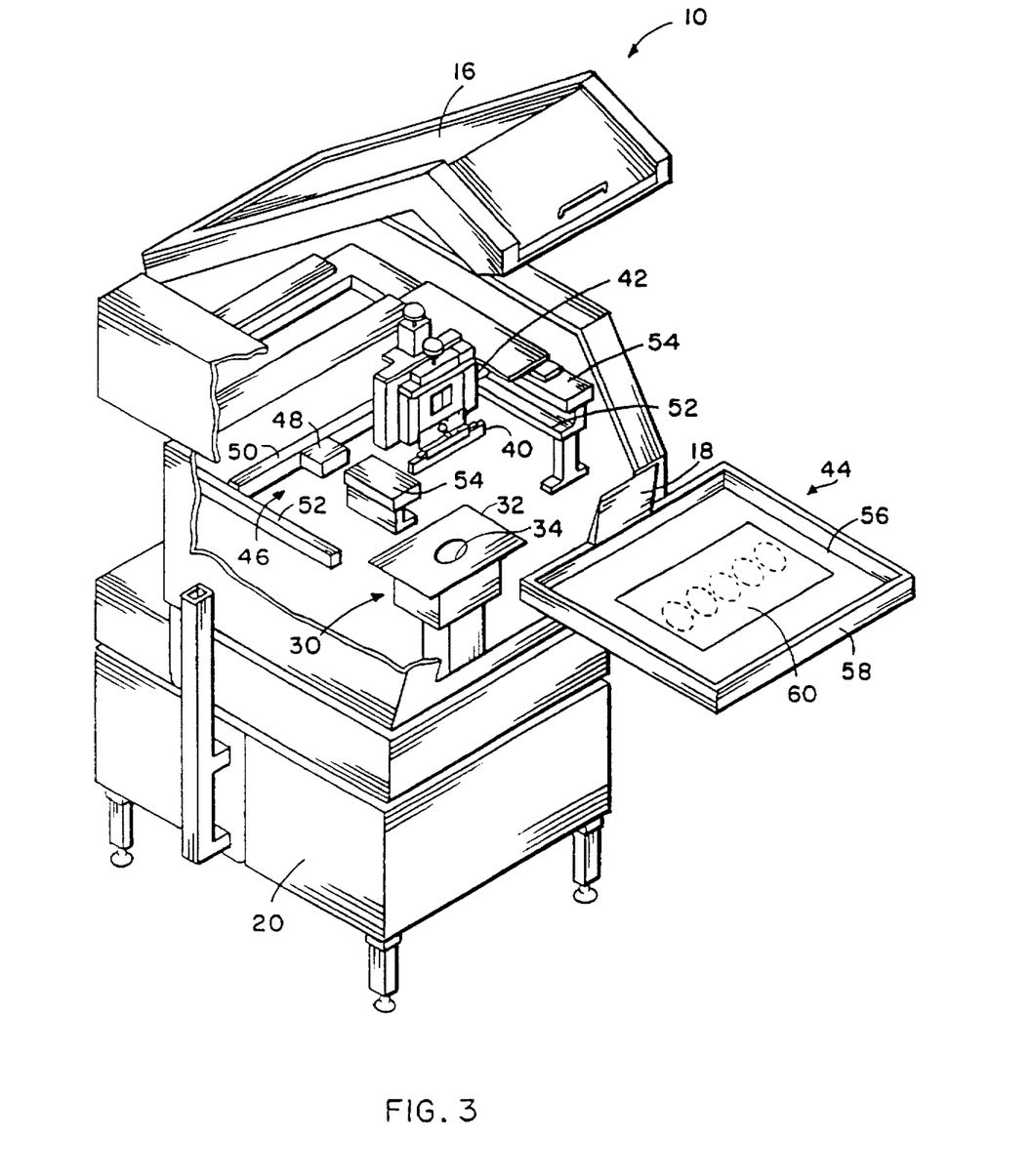
FIG. 3 is a front perspective view of the screen printer shown in FIG. 1, partly cut away so that some of the interior of the printer can be seen.

FIGS. 1–3 are simplified showings of a computer controlled automatic screen printer 10 manufactured by MPM Corporation of Franklin, Mass. and having a model number of AP20/24X. The printer 10 is used to screen print printed circuit boards with solder paste and incorporates circuit board support and vacuum hold in place apparatus according to the principles of the invention.

The printer 10 includes a monitor 12 and keyboard 14 that are used to display setup and operational information to a user of the printer 10. The monitor 12 and the keyboard 14 are situated next to an upper printer door 16 and lower printer door 18. Control and other equipment, including air removal equipment, is located primarily in the lower portion 20 of the printer 10.

As shown in FIG. 2, the printer 10 includes a circuit board receiving slot 22 and a conveyor arrangement that comprises conveyor arms 24 carrying driven conveyor belts 26. A circuit board, like circuit board 28 with clusters of electronic components 29 on one side of it (see FIG. 4), placed on the conveyor belts 26 is carried to a printing station in the printer 10.

The printer 10 further includes internal positioning means to move the circuit board 28 to the printing station and there to bring the board 28 into position with a stencil (screen) and squeegee apparatus for printing. The positioning means includes apparatus for positioning in X, Y, and Z directions. And this apparatus includes a programmable X-Y gantry system, working with a Z tower 30 (see FIG. 3), to move the supported circuit board 28 in the vertical direction to print height. The Z tower 30 includes a horizontally disposed mounting plate 32 that has an opening 34 in communication with air removal equipment of the printer 10. As more fully discussed hereinafter, the mounting plate 32 of the Z tower 30 carries the apparatus for supporting and holding the circuit board 28 in place during the printing cycle (not shown in FIG. 3; see FIGS. 4 and 5).

Referring more particularly to FIG. 3. The partial cut away and the open position of upper door 16 contributes to a showing within the printer 10 of; a squeegee 40 carried by squeegee adjustment apparatus 42; a screen frame 44 in a position ready to be mounted in the printer 10; and a portion of a vision system 46 including camera 48 carried on a support bar 50, which is movably mounted in the printer 10 on guide bars 52. The screen frame 44 slides into the rails of mounting bars 54 (for mounting in the printer 10) and includes fine mesh fabric 56 stretched on a frame 58. A metal foil or screen 60 is carried on the frame 58 in a known way by the fabric 56. The stencil 60 has been prepared in a conventional way to have small openings through which solder paste is printed onto circuit boards by operation of the squeegee 40 during the printing cycle. When the screen frame 44 is in printing position in the printer 10, it is in printing relationship beneath the squeegee 40. The camera 48 is carried at a level below the positioned screen frame 44 for movement into and out of the printing station of the printer 10.

The vision system 46 automatically aligns a printed circuit board with the stencil 60 by using the programmable x-y gantry system with the camera 48. The system 46 uses the camera 48 to locate pre-selected and positioned targets on the circuit board 28 and the stencil 60, known as fiducials, to align the stencil 60 and the circuit board 28 during the printing cycle.

The positioning means of the printer 10 includes a tactile sensor 62 (see FIG. 6) to position the Z tower 30 vertically during setup for printing. As illustrated, the sensor 62 is mounted on a shelf 63 and includes a sensor switch 64 and a pneumatic slide assembly 65 that carries the sensor switch 64. During setup, the slide assembly 65 is in an extended vertical position that locates the sensor switch 64 at an elevated position. The shelf 63 moves with the Z tower. Hence, as the Z tower is moved upwardly in the vertical direction during setup, the sensor 62 is also moved upwardly to bring it into close proximity with the underside of the screen frame 44. The proper vertical location of the screen 60 is established when the sensor switch 64 is closed by contact with the underside of the screen frame 44.

Figure 4:
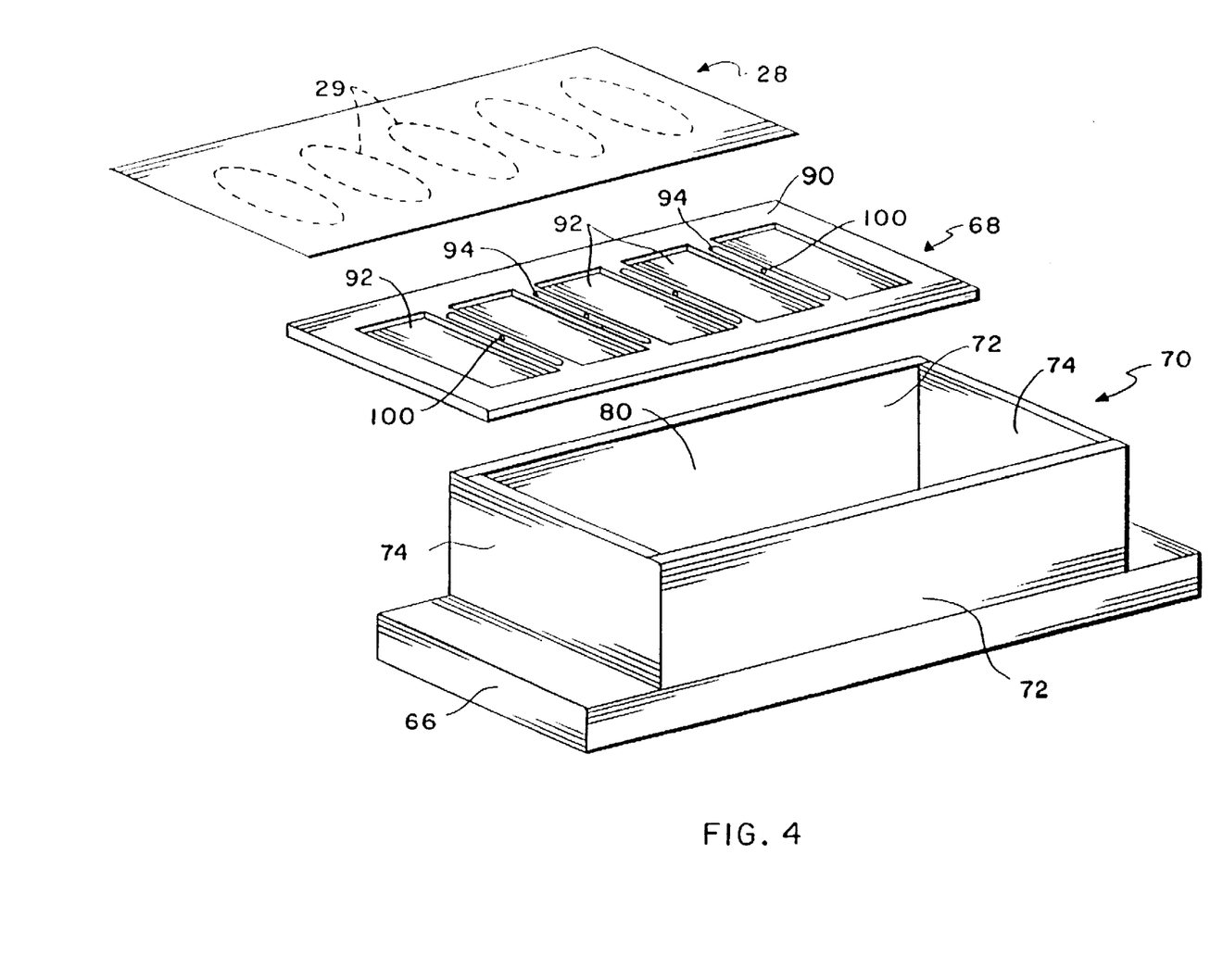
FIG. 4 is a somewhat exploded view of the apparatus incorporated in the printer of FIGS. 1–3 for supporting and holding a circuit board in place during the printing cycle according to the principles of the invention.
Figure 5:
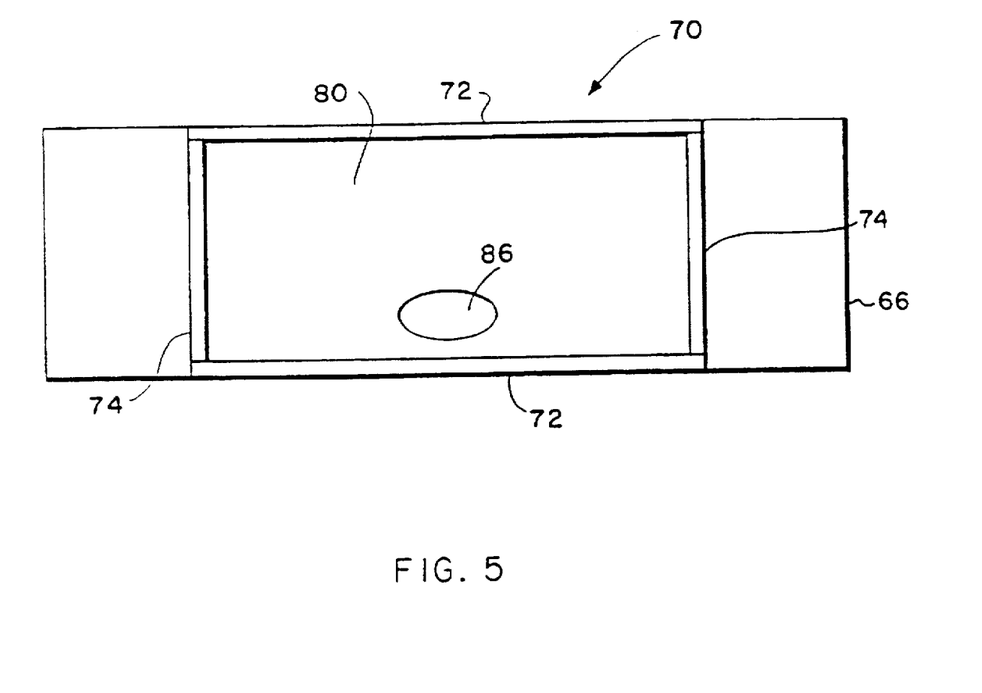
FIG. 5 is plan view of the apparatus shown in FIG. 4 for supporting and holding a circuit board in place during the screen printing cycle.
Figure 6:
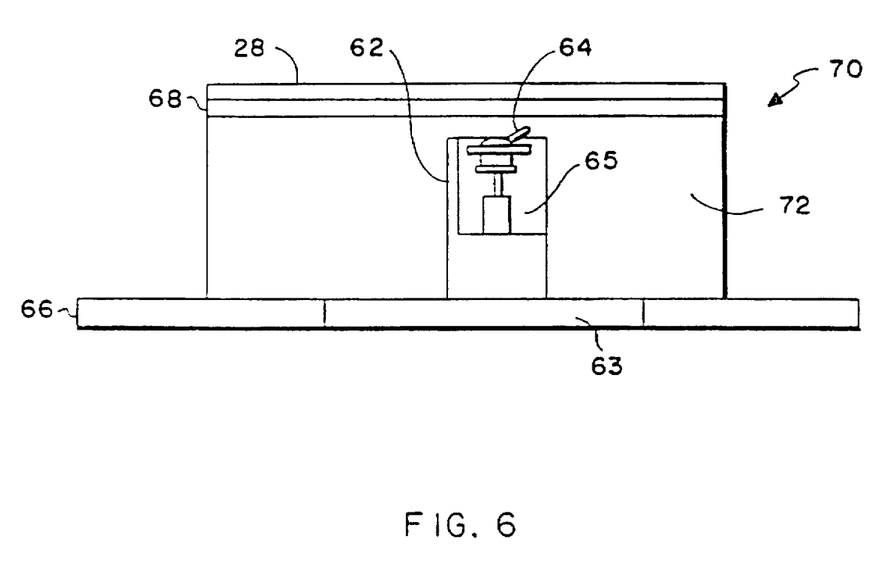
FIG. 6 is a front elevation view of the apparatus shown in FIGS. 4 and 5 for supporting and holding a circuit board in place during the printing cycle, with a further showing of a tactile sensor.

FIGS. 4–6 show screen support and holding apparatus that mounts within printer 10 on the support plate 32 of the Z tower 30, such as by screws (not shown). The apparatus includes a base plate 66, a support plate 68, and a box 70 carried by the base plate 66. The box 70 is shown joined to the base plate 66 and includes joined together sidewalls 72 and end walls 74. For stability, the base plate 66 is fairly thick material, such as aluminum of about 0.75 inches or so. Moreover, the tolerance of the planar mounting surface of the plate 66 should be small since the box 70 must provide accurate positioning of the printed circuit board 28. In the embodiment shown in the figures, the box 70 is 4.5 inches wide and 17 inches long.

Referring to FIG. 5, it can be seen that there is an opening 86 through the base plate 66. The opening 86 is shown located in the center chamber 80 and is positioned to align with the opening 34 in the mounting plate 32 of the Z tower 30 when the support and holding apparatus is in positioned on the Z tower 30.

During the printing cycle, air is withdrawn from the chamber 80 through the opening 86 by air withdrawal apparatus of the printer 10. This means that when the support plate 68 is mounted on the box 70 (see FIG. 6), air from the chamber 80 is removed through the opening 86 and the opening 34 of the support member 32.

As shown in FIG. 4, the support surface 90 of the support plate 68 has: five rectangular recess pockets 92 having a size sufficient for receiving electronic components 29 (without damaging them) located on the side of the printed circuit board 28 facing the support surface 90 during support on the support plate 68, and four elongated grooves 94 extending transverse to the plate 68 between the recess pockets 92 and in closed spaced relation with the pockets 92. Also, the plate 68 has four passageways 96 extending through its thickness, each of which terminates on the support surface 90 side of the plate 68 at an opening 100 located in a groove 94. The surfaces defining the recess pockets 92 are without air removal passageways.

When the support plate 68 is in place on the box 70, the passageways 96 in the plate 68 communicate with the chamber 80. Accordingly, as air is removed from the chamber 80 through the opening 86, air is drawn into the passageways 96. When the circuit board 28 is resting in position on the support surface 90 of the support place 68 over the pocket recesses 92 and the grooves 94 during air removal from the vacuum chamber 80, reduced pressure is established in the grooves 94. And this reduced pressure holds the circuit board in place on the support plate 68 during the printing cycle.

Figures 7, 8:
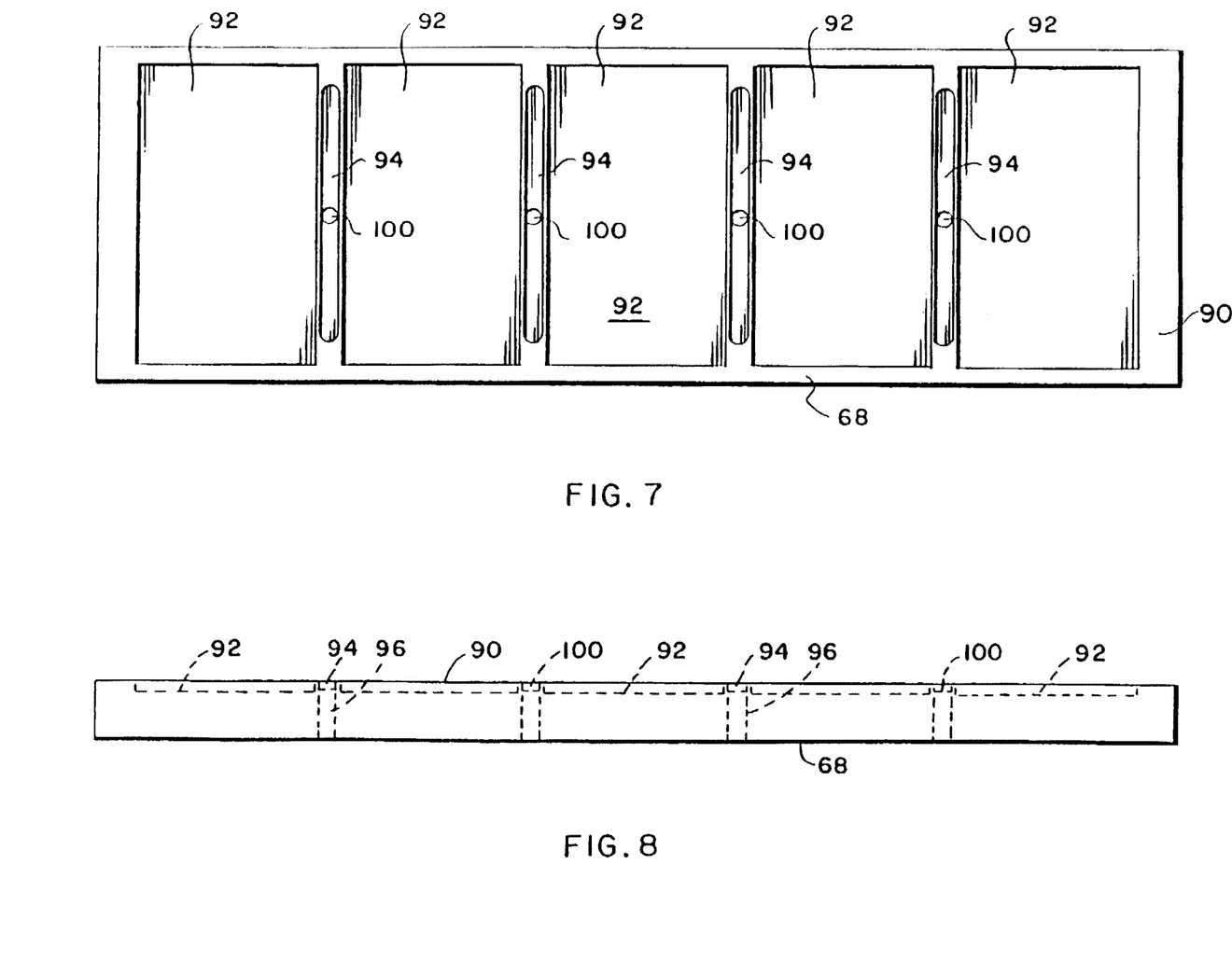
FIG. 7 is a somewhat enlarged plan view of the support member shown in FIG. 4 and on which a circuit board rests during screen printing.
FIG. 8 is a side elevation view of the support member shown in FIG. 7.

As shown in the embodiment of FIGS. 4, 7, and 8, the support plate 68 is made of aluminum and is 17 inches long, 5.1 inches wide, and 0.938 inches thick. Each of the recess pockets 92 is 2.79 inches wide, 4.85 inches long, and 0.2 inches deep. Each of the grooves 94 is 0.313 inches wide, 4.0 inches long, and 0.2 inches deep. Each of the grooves 94 is spaced 0.044 inches from the lengthwise side of its associated recess pockets 92.

In operation, the printer 10 goes through a sequence of steps in stencil printing a printed circuit board. A board, for instance the board 28, is moved into supported relationship on the surface 90 of the support member 68 in the printing station below the screen 60 in the printer 10. This step includes moving the board through the receiving slot 22 on the driven conveyor belts 26. When the board 28 is at the printing station, positioning apparatus raises the Z tower to proper vertical location using the sensor 62; the vision system, using the camera 48, operates with the X-Y gantry system to align the screen 60 with the board 28. The vacuum system withdraws air from the chambers 80, 82, and 84 to establish reduced pressure in the grooves 94 and thereby hold the board 28 in position during printing. A reduced pressure of from 15–25 inches of mercury has given good results. The squeegee 40 is moved across the upper surface of the screen 60 to move solder paste, supplied to the screen 60 manually or in a known automated fashion, through the openings thereof to print the board 28.

Figure 9:
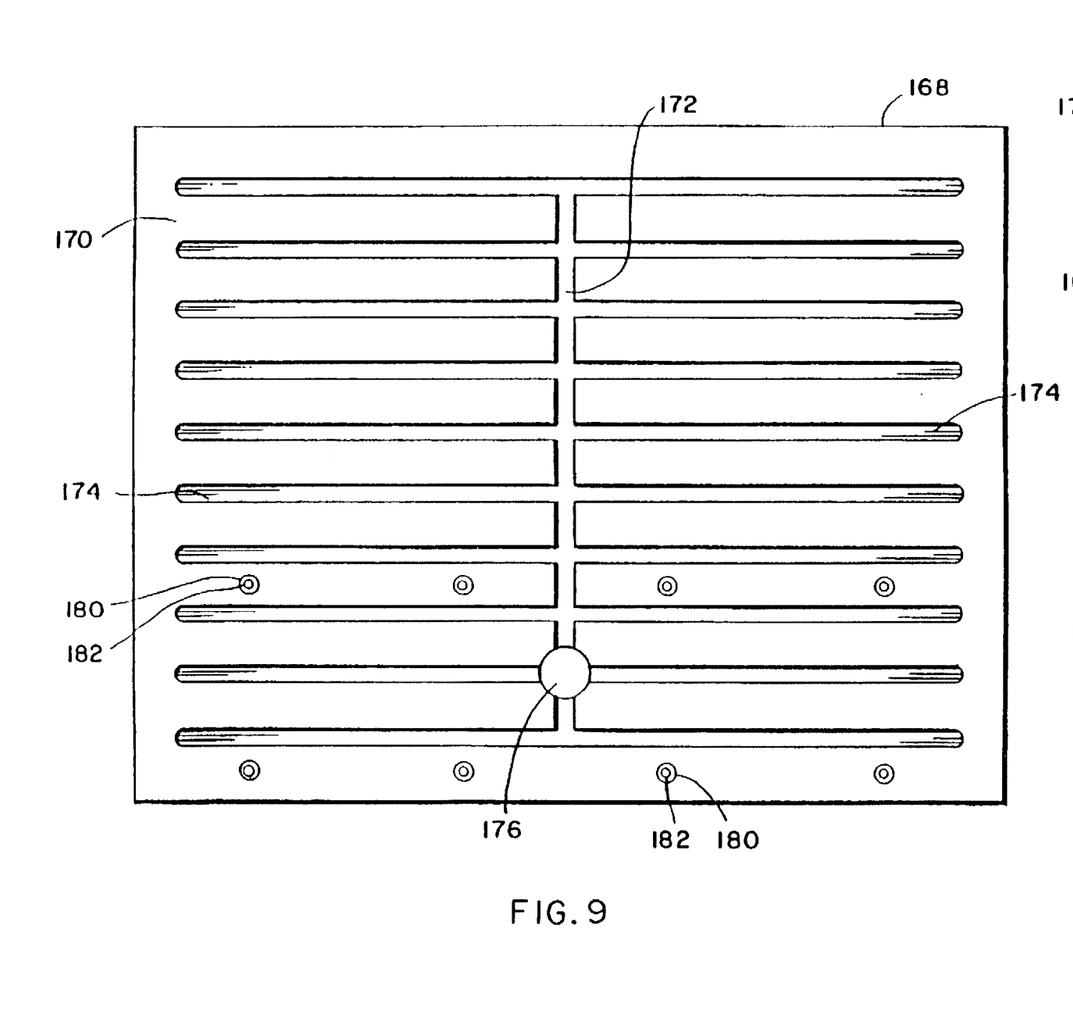
FIG. 9 is a plan view of an alternate embodiment of a support member according to the principles of the invention.
Figure 10:
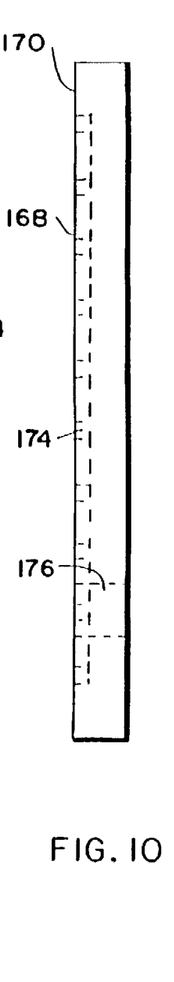
FIG. 10 is a side elevation view of the support member shown in FIG. 9.

FIGS. 9 and 10 show a support plate 168, which is an alternate embodiment of a support plate according to the principles of the invention. The plate 168 is intended for use with printed circuit boards before any components have been mounted on them. As shown, the plate 168 has a support surface 170 on which a circuit board rests. And the support surface 170 has a main groove 172 and distribution grooves 174, which are all shown to be the same length. The distribution grooves 174 intersect the main groove 172 in communicating relationship with the main groove 172 at spaced locations along its length. The main groove 172 and distribution grooves 174 are shown in their preferred intersecting relationship-normal to each other.

As shown, the member 168 has only one air removal passageway 176, which extends through the thickness of the member 168. The passageway 176 terminates at the support surface 170 side of the plate 168 at an opening in the main groove 172. Accordingly, all the distribution grooves 174, the main groove 172, and the passageway 176 are all in communication with each other.

It may be advantages in some instances to have more than one air removal passageway opening in the main groove 172, and perhaps even in some or all of the distribution grooves 174.

The support plate 168 can replace the support plate 68 in apparatus for supporting and holding a circuit board in place shown FIGS. 4–6 and mounted on the Z tower 30 in the printer 10. Mounting openings 180 and screws 182 are illustrated for use in joining the plate 168 with the box 70.

As shown, the plate 168 is made of aluminum and is 17 inches long, 13.13 inches wide, and 0.94 inches thick. The main groove 172 is 11 inches long, 0.375 inches wide, and 0.2 inches deep; the distribution grooves 174 are each 7.3 inches long, 0.375 inches wide, and 0.2 inches deep. The distribution grooves 174 are spaced apart 1.25 inches along the length of the main groove 172, except for the top two grooves shown in FIG. 9; these top two grooves are spaced apart 1.0 inch. The passageway 176 is shown larger in diameter than the width of the main groove 172: 1.0 inch in diameter.

As is apparent, although the plate 168 is wider than the width of the box 70, the passageway 176 is positioned to be in communication with the main chamber 80 (and hence the opening 34 in the mounting plate 32 of the Z tower 30) when the plate 168 is on the box 70, and the box 70 is in place on the Z tower 30.

Figure 11:
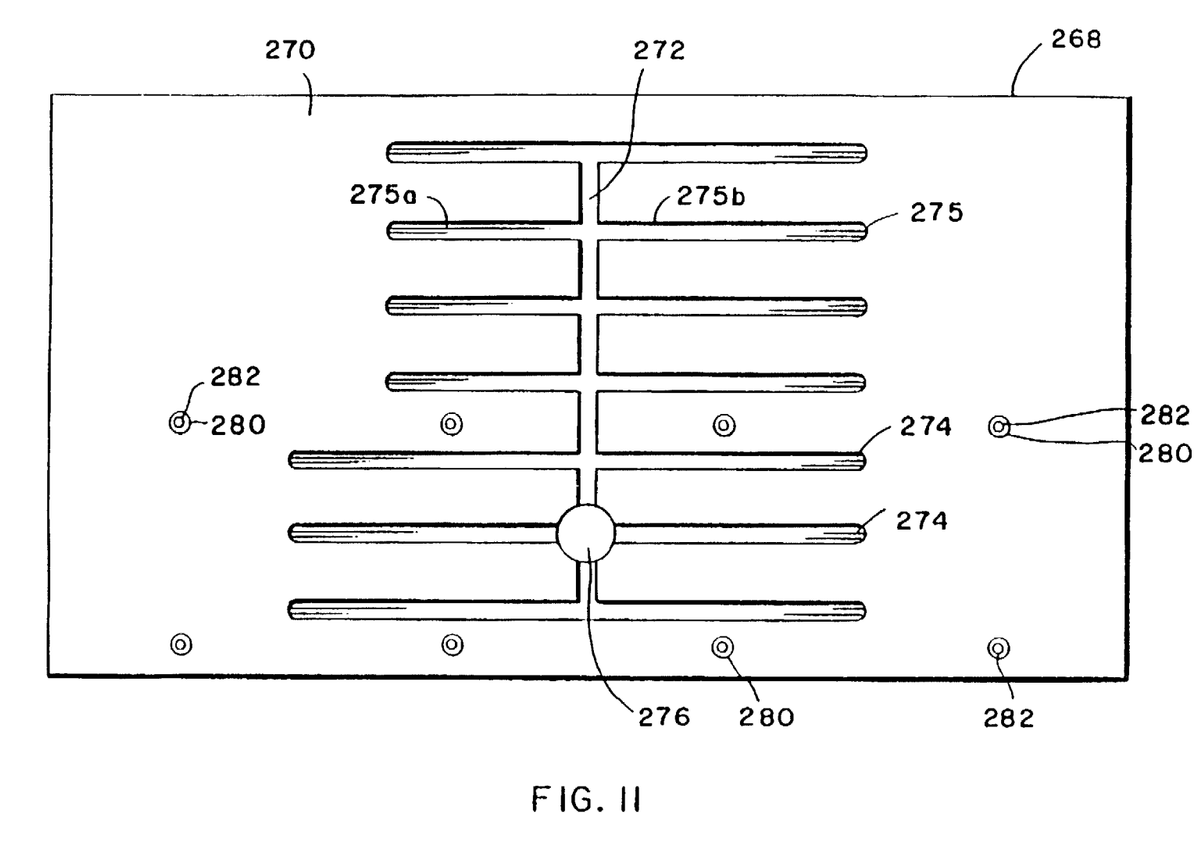
FIG. 11 is a plan view of yet another alternate embodiment of a support member according to the principles of the invention.
Figure 12:
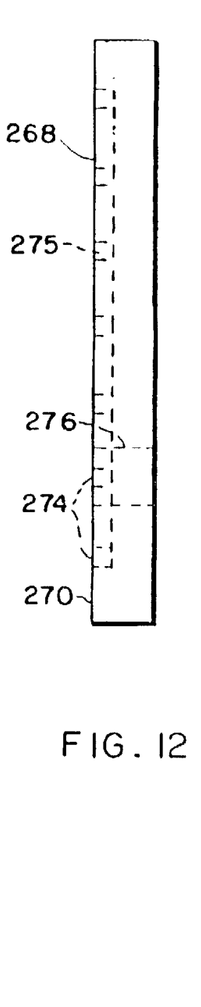
FIG. 12 is a side elevation view of the support member shown in FIG. 11.

FIGS. 11 and 12 show a support plate 268, which is another alternate embodiment of a support plate according to the principles of the invention. And like the plate 168, plate 268 is intended for use with printed circuit boards before any components have been mounted on them. The plate 268 has a support surface 270 on which a circuit board rests. And the support surface 270 has a main groove 272 and distribution grooves 274 and 275. The distribution grooves 275 have unequal distribution sections 275a and 275b, with sections 275a being shorter than sections 275b. The distribution grooves 274 and 275 intersect the main groove 272 in communicating relationship with the main groove 272 at spaced locations along its length. The main groove 272 and the distribution grooves 274 and 275 are shown in their preferred intersecting relationship-normal to each other.

The member 268 has only one air removal passageway 276, which extends through the thickness of the member 268. The passageway 276 terminates at the support surface 270 side of the plate 268 at an opening in main groove 272. Accordingly, all the distribution grooves 274, the main groove 272, and the passageway 276 are all in communication with each other.

The support plate 268 can replace the support plates 68 and 168 with apparatus for supporting and holding a circuit board in place shown in FIGS. 4–6 and mounted on the Z tower 30 in the printer 10'. Mounting opening 280 and screws 282 are shown for use in joining the plate 268 with the box 70.

As with the member 168, it may be advantages in some instances to have more than one air removal passageway opening in the main groove 272, and perhaps even in some or all of the distribution grooves 274 and 275.

As shown, the plate 268 is made of aluminum and is 17 inches long, 9.28 inches wide, and 0.94 inches thick. The main groove 272 is 8.8 inches long, 0.38 inches wide, and 0.19 inches deep. The distribution grooves 274 are 9.0 inches long; the distribution grooves 275 are 7.6 inches long (sections 275a are 3.2 inches long; sections 275b are 4.7 inches long). All the distribution grooves are 0.38 inches wide and 0.19 inches deep. The passageway 276 is shown larger in diameter than the width of the main groove 272: 1.0 inch in diameter.

As with the plate 168, plate 268 is wider than the width of the box 70, but the passageway 276 is positioned to be in communication with the main chamber 80 (and hence the opening 34 in the mounting plate of the Z tower 30) when the plate 276 is mounted on the box 70, and the box 70 is in place on the Z tower 30.

In view of the foregoing apparatus of various aspects of the invention, it will be understood that modifications and variations may be effected without departing from the scope and spirit thereof.

I claim:

1. Apparatus for supporting and holding a circuit board in place during screen printing a major surface thereof with solder paste comprising:

an open topped box including a bottom wall and joined together upstanding walls extending from the bottom wall, the box defining an interior vacuum chamber, the bottom wall having an air exit opening therethrough;

air removing apparatus to establish reduced pressure in the interior vacuum chamber by moving air downwardly in the interior vacuum chamber to exit therefrom through the air exit opening in the bottom wall; and a generally planar member of rigid material resting on the upstanding walls and covering the opening of the open topped box, the member having an outwardly facing support surface for supporting a circuit board placed directly thereon for solder paste printing through a screen, the support surface having a main groove and distribution grooves therein, the distribution grooves each including two aligned sections extending in a direction laterally of the main groove on opposite sides thereof and intersecting the main groove in communicating relationship therewith at spaced locations along the length of the main groove, the member having an air removal passageway extending therethrough from the outwardly facing surface side to the opposite side thereof, such passageway terminating on the one side of the member at an opening located in the main groove, the passageway being in communication with the interior vacuum chamber of the open topped box, such that a circuit board placed on the support surface over the grooves will be held in place on the member during screen printing with solder paste as a result of reduced pressure established in the main and distribution grooves when air is withdrawn from them through the passageway when reduced pressure is established in the interior vacuum chamber do to air being removed therefrom through the air exit opening by the air removal apparatus.

2. The apparatus of claim 1 wherein one of the two aligned sections of one of the distribution grooves is shorter than the other section.

3. Apparatus for supporting and holding a circuit board having components on a lower side thereof in place during screen printing a major surface thereof with solder paste comprising:

a generally planar member of rigid material having an upper support surface for supporting a circuit board as such board receives solder paste printing through a screen, the support surface having a plurality of pocket recesses therein for receiving electronic components in any one of a plurality of configurations on the circuit board and at least one closed-ended groove in between each of said pocket recesses, the member having an air removal passageway extending from its upper side to its lower side, said passageway being in communication with said closed-ended grooves, each of said pocket recesses being fully peripherally bounded by portions of said upper surface of said member, said pocket recesses and said grooves having a combined open area which is a major portion of the total area of said upper support surface of said member, such that when a circuit board having components in any one of a plurality of configurations on the lower side thereof is positioned on the upper support surface, said components will fit into said pocket recesses and/or said grooves without interference, and will be held in place on said upper support surface during screen printing as a result of reduced air pressure established in the grooves when air is withdrawn therefrom through the passageway.

4. Apparatus for supporting and holding a circuit board having components on a lower side thereof in place during screen printing a major surface thereof with solder paste comprising:

an open topped box including a bottom wall and joined together upstanding walls extending from the bottom wall, the box defining an interior vacuum chamber, said vacuum chamber having an opening therethrough;

means for removing air from the interior vacuum chamber through said opening in said vacuum chamber; and a generally planar member of rigid material having a lower surface supported on upper edges of the upstanding walls and covering the opening of the open topped box, the member having an upper support surface for supporting a circuit board as the circuit board receives solder paste printing through a screen, the support surface having a plurality of pocket recesses therein for receiving electronic components in any one of a plurality of configurations on the circuit board and at least one closed-ended groove in between each of said pocket recesses, the member having an air removal passageway extending from its upper side to its lower side, said passageway being in communication with said closed-ended grooves, each of said, pocket recesses being fully peripherally bounded by portions of said upper surface of said member, said pocket recesses and said grooves having a combined open area which is a major portion of the total area of said upper support surface of said member, such that when a circuit board having components in any one of a plurality of configurations on the lower side thereof is positioned on the upper support surface, said components will fit into said pocket recesses and/or said grooves without interference, and will be held in place on said upper support surface during screen printing as a result of reduced air pressure established in the grooves when air is withdrawn therefrom through the passageway.

* * * * *